United States Patent [19]

Ohno et al.

[11] Patent Number: 4,500,906
[45] Date of Patent: Feb. 19, 1985

[54] MULTILEVEL MASTERSLICE LSI WITH SECOND METAL LEVEL PROGRAMMING

[75] Inventors: Kenichi Ohno, Tokyo; Tohru Hosomizu, Yokohama; Rokutaro Ogawa, Tokyo, all of Japan

[73] Assignee: Fujitsu Limited, Kawasaki, Japan

[21] Appl. No.: 378,046

[22] Filed: May 14, 1982

Related U.S. Application Data

[63] Continuation of Ser. No. 150,799, May 19, 1980, abandoned.

[30] Foreign Application Priority Data

May 24, 1979 [JP]  Japan ................................. 54-63203
May 25, 1979 [JP]  Japan ................................. 54-63965

[51] Int. Cl.³ .......................................... H01L 23/48
[52] U.S. Cl. ...................................... 357/71; 357/40;
357/45; 357/68
[58] Field of Search ...................... 357/68, 71, 40, 45;
307/465, 466, 467

[56] References Cited

U.S. PATENT DOCUMENTS

| | | | |
|---|---|---|---|
| 3,573,488 | 4/1971 | Beelitz | 307/467 |
| 3,641,661 | 2/1972 | Canning et al. | 357/40 |
| 3,721,838 | 3/1973 | Brickman et al. | 357/40 |
| 3,808,475 | 4/1974 | Buelow et al. | 357/45 |
| 4,207,556 | 6/1980 | Sugiyama et al. | 307/467 |

FOREIGN PATENT DOCUMENTS 2374817  7/1978  France .

OTHER PUBLICATIONS

Okabe et al., Electronics and Communications in Japan, vol. 55-C, No. 11, pp. 78-85, (1972).
Puri, IBM Tech. Discl. Bulletin, vol. 19, No. 7, Dec. 1976, pp. 2630-2631.

Primary Examiner—William D. Larkins
Attorney, Agent, or Firm—Staas & Halsey

[57] ABSTRACT

A semiconductor device comprising a semiconductor bulk in which a plurality of basic circuit elements are formed, first interconnecting lines being formed on a first insulation layer of said semiconductor bulk, a second insulation layer formed on both said first insulation layer and said first interconnecting lines, and a cell in which said basic circuit elements are connected with each other by said first interconnecting lines, wherein the first interconnecting line for connecting two of said basic elements in the cell has two separated parts, one end of each of said parts is connected to one of said basic elements, said second insulation layer is provided with a pair of through-holes in the cell, and each of said pair of through-holes contacts with the other end of each of said parts.

5 Claims, 6 Drawing Figures

MULTILEVEL MASTERSLICE LSI WITH SECOND METAL LEVEL PROGRAMMING

This is a continuation, of application Ser. No. 150,799 filed May 19, 1980, now abandoned.

BACKGROUND OF THE INVENTION

The present invention relates to a semiconductor device, and more particularly relates to a so-called masterslice semiconductor device.

In recent years a demand has arisen for fabrication of a large integrated semiconductor device which is suitable for low volume, wide variety manufacturing, without increasing the manufacturing cost and the manufacturing time. In response to this demand, the so-called masterslice semiconductor device has been proposed. In the usual masterslice semiconductor device, as is well known, first a large number of basic elements or regions are formed on a single semiconductor substrate; however, no interconnecting lines are formed between basic elements. Each of the cells is usually comprised of basic elements, such as transistors, resistors, diodes and so on. A semiconductor substrate comprised of only such basic elements is suitable for mass production. After mass production of the semiconductor substrate, the desired interconnecting lines between the basic elements and cells are then formed thereon by using specific masks for multilayer wiring, in accordance with a variety of large scale integrated circuits to be fabricated for obtaining respective desired logic circuits.

For the purpose of achieving a quick turnaround time and also reducing cost for manufacturing various kinds of, but small amounts of, LSIs, when compared to the above mentioned conventional masterslice LSI, the special masterslice LSI of the present invention is very useful.

In this special masterslice semiconductor device, since the basic cells, each comprising transistors, resistors, diodes, segments of interconnection metal lines of a lower metal layer and through holes, are originally mass produced in the semiconductor substrate, a desired device can be completed by, for example, simply preparing a specific mask for forming the desired interconnecting lines every time a need for obtaining certain logic circuits occurs. Accordingly, a reduction of the manufacturing time, or in other words quick turnaround time, can be achieved. Further, since the mass produced cells can be commonly utilized for obtaining any of the various kinds of logic circuits and most of the masks for producing the cells also can be commonly utilized for various cell types, thereby a reduction in manufacturing cost can be achieved.

However, the following requirements have arisen regarding the above mentioned special masterslice semiconductor device. That is, thirdly, the electric power consumption of the masterslice semiconductor device should be reduced. Fourthly, the types of logic circuits should further offer a large variety. Fifthly, the length of the metal wiring on the special masterslice semiconductor device should be shortened. The reasons why the above mentioned third through fifth requirements have arisen will be explained hereinafter.

SUMMARY OF THE INVENTION

It is an object of the present invention to provide a semiconductor device which can satisfy the above mentioned five requirements simultaneously.

BRIEF DESCRIPTION OF THE DRAWINGS

The present invention will be more apparent from the ensuing description with reference to the accompanying drawings wherein.

DETAILED DESCRIPTION OF PREFERRED EMBODIMENTS

As previously mentioned, the special masterslice semiconductor device can provide many advantages. However, the special masterslice semiconductor device (hereinafter referred to as simply a "semiconductor device") has shortcomings. One of the shortcomings is that, although a great number of cells are formed on the common semiconductor substrate, not all of the cells are used to obtain the desired logic circuits. Since these non-used basic cells perform no electrical functions, but still consume electric power supplied to the semiconductor device, it is desirable to eliminate such uneconomical electric power consumption. This corresponds to the above mentioned third requirement.

Another of said shortcomings is as follows. In the old type semiconductor device, both the kinds of cells and the arrangement of the cells on the chip are determined, in advance, fixedly, and accordingly, the length of each interconnecting line for fabricating desired logic circuits, becomes very long. Therefore, the stray capacity formed along each said interconnecting line becomes very large, and high switching speed cannot be expected. Further, since the pattern for distributing said interconnecting lines becomes complicated, the manufacturing efficiency is considerably reduced. Consequently, it is desired to shorten the length of metal lines on the primary semiconductor device. This corresponds to the above mentioned fifth requirement.

As previously mentioned, one of the advantages of the semiconductor device is that various kinds of logic circuits can easily be fabricated merely by interconnecting lines between and in particular cells. Therefore, if the number of said various kinds of logic circuits could be increased, more complicated logic functions could be achieved by the same semiconductor device. Consequently, it is desired to be able to easily increase the number of the various kinds of logic circuits, and this corresponds to the above mentioned fourth requirement demand.

Figure 1:
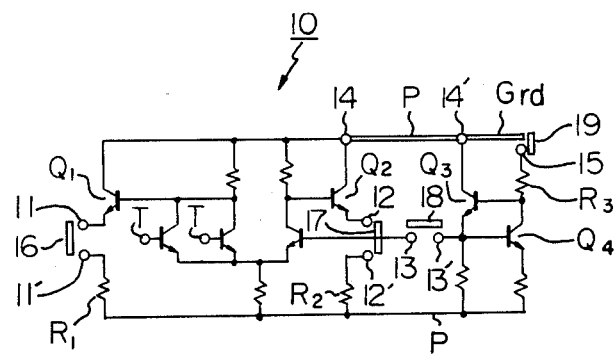
FIG. 1 is a circuit diagram of one example of a basic cell fabricated according to the present invention.

In FIG. 1, which is a circuit diagram of one example of a basic cell fabricated according to the present invention, a basic cell 10 forms a well known ECL (emitter-coupled logic) circuit. However, it should be noted that the basic cell is not limited to the ECL circuit, but can also be formed as other well known logic circuits. A large number of basic cells 10 are arranged in the semiconductor therein. However, only one of these basic cells is illustrated in FIG. 1. In this figure, the portions indicated by the small circle represent through-holes according to the present invention. Almost all of these through-holes are created at a specified portion of the interconnecting lines. For example, in the basic cell (ECL circuit) 10, the through-holes 11 and 11' are formed at an emitter follower stage thereof, which is comprised of a transistor $Q_1$ and a resistor $R_1$. That is, the through-holes 11 and 11' are formed on the interconnecting line between the transistor $Q_1$ and the resistor $R_1$. First, this interconnecting line is partially cut off and, then, the through-holes 11 and 11' are formed at respective open ends thereof. The open ends may also be created by partially removing the interconnecting line or partially leaving a space therein. Similarly, through-holes 12 and 12' are formed at an emitter follower stage of the basic cell (ECL circuit) 10, which is comprised of a transistor $Q_2$ and a resistor $R_2$. Also, through-holes 13 and 13' are formed on an interconnecting line between the current switch stage and a biasing stage comprised of transistors $Q_3$ and $Q_4$. Through-holes 14 and 14' are always formed in a ground line Grd. Thus, a plurality of pairs of the through-holes (11, 11'), (12, 12'), (13, 13') and so on are incorporated in both the interconnecting lines and power line of each basic cell (10). However, a single through-hole may also be incorporated therein, such as a through-hole 15 which is not part of a pair of through-holes.

In FIG. 1, portions indicated by the reference symbol T are also through-holes. These through-holes are used to connect cells or an input terminal of the device, via the uppermost metal layer.

If the basic cell 10 is required to operate as a standard ECL circuit having OR/NOR gate functions, the through-holes (11, 11'), (12, 12') and (13, 13') are electrically shorted by conductors 16, 17 and 18, respectively. The through-holes (14, 14') are always connected to the ground line Grd. Further, the single through-hole 15 and the ground line Grd are electrically shorted by a conductor 19.

On the other hand, if the basic cell 10 is not used in the semiconductor device, the conductors 16, 17, 18 and 19 are not incorporated therein. Accordingly, the through-holes (11, 11') through (13, 13') and the through hole 15 are left electrically open. In this case, the basic cell 10 is not energized and, accordingly, the previously mentioned first requirement is satisfied.

It is preferable to maintain many semiconductor devices to be almost the same temperature, in order to obtain good operational stability thereof. However, practically, the temperature of a certain semiconductor device may be lower than the other devices, if many cells in said certain devices are not energized. In this case, although the cells included in said certain devices are non-used cells, these cells can easily be energized later merely by mounting said conductor of the present invention thereon so as to supply power thereto. When these basic cells are energized, they will have almost the same temperature as that of the remaining devices, and accordingly, good operational stability may be satisfied.

As previously mentioned, the logic circuits of the semiconductor device should have a large variety. Although, in FIG. 1, the basic cell 10 is initially designed as an ECL circuit, the basic cell 10 may be formed as, for example a biasing circuit merely by electrically shorting only the through-hole 15 (See also FIG. 4) and the ground line Grd by means of the conductor 19. Similarly, the output of the transistor $Q_1$ may be connected to another transistor (not shown), if necessary, in order to make emitter-dotting via the through-hole 11 and the uppermost metal line, by not providing the conductor 16. The emitter-dotting means a connection, between the emitter of an output transistor to another circuit. Also, the through-holes (11, 11', 13, 13' . . . ) may be utilized for creating to a NOR gate having an internally terminated resistor. When an OR function is required, the through-holes (12, 12', 13, 13' . . . ) are used. In FIG. 1, basic cells are taken as an example. However, in complicated cells, such as cells comprising flip-flops including many basic circuits, said cells can be utilized as the flip-flops or the basic gates by rearranging the distribution of the metal layer formed on the uppermost layer. Thus, the previously mentioned second requirement can be satisfied.

Figure 2:
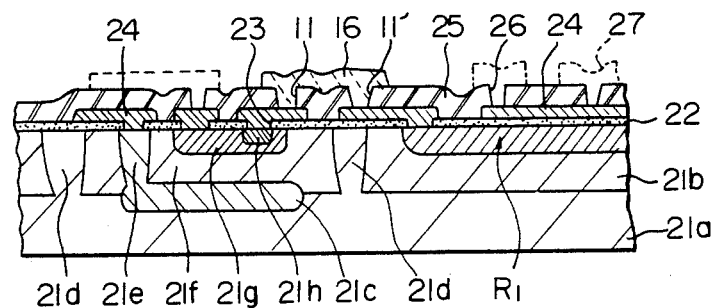
FIG. 2 is a cross sectional view of a part of a basic cell 10 in FIG. 1.

A part of the basic cell 10 illustrated in FIG. 1 is illustrated in a cross sectional view in FIG. 2. In this figure, the through-hole 11, the conductor 16, the transistor $Q_1$, the interconnecting line, which members are illustrated in FIG. 1, and also their neighboring members (not shown in FIG. 1), are illustrated. The reference numeral $21_a$ represents a p-type semiconductor substrate. An n-type epitaxial growth layer $21_b$ is formed on the substrate $21_a$. An n+-type buried layer $21_c$ is formed between the substrate $21_a$ and the layer $21_b$. The reference numeral $21_d$ represents p-type or p+-type isolation region which electrically isolates one basic element from adjacent basic elements. The reference numeral $21_e$ represents an n+-type collector contact region. The transistor $Q_1$ of FIG. 1 is fabricated as an n-type collector region $21_f$, a p-type base region $21_g$ and an n-type emitter region $21_h$.

A first insulation layer 22 is covered on the surface of the semiconductor bulk, which is a combination of the epitaxial growth layer $21_b$ and the semiconductor substrate $21_a$. Further, first interconnecting lines 24 are formed on the first insulation layer 22. Each of the interconnecting lines 24 can electrically contact respective windows, such as windows 23, which are formed in the first insulation layer 22.

Generally, the above mentioned members $21_a$ through $21_h$, 22, and 23 comprise the conventional common semiconductor device (master semiconductor device). In the present invention, a first metal layer 24 and a second insulation layer 25 are further formed on both the first insulation layer 22 as the common masterslice devices. The second insulation layer 25 is provided with the through-holes (through-holes 11, 11', 12, 12', 13, 13', 14, 14', 15 illustrated in FIG. 1), according to the present invention, located at the specified portions and on the first interconnecting lines 24 and also as the common masterslice devices for various kinds of logic circuits. Second interconnecting lines are formed on the second insulation layer 25. One of the second interconnecting lines is indicated as the conductor 16. The conductor 16 is bridged, if necessary, between the through-hole 11 and the through-hole 11' (see FIG. 2). The conductor 16 can be manufactured simultaneously with the process of manufacturing the second interconnecting lines 27, indicated by long and short dash lines. The second interconnecting lines 27 are utilized for electrically connecting other cells (not shown), conventional peripheral circuits (not shown) or chip input-output terminals via through-holes 26 formed in the layer 25. The through-holes 26 correspond to, for example, the aforesaid through-holes T in FIG. 1.

Figure 3:
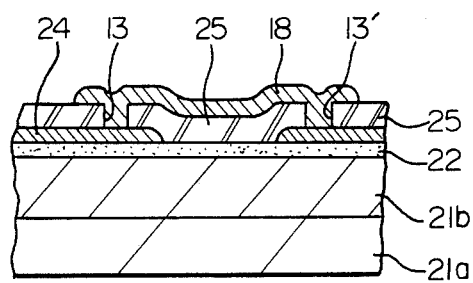
FIG. 3 is a cross sectional view of members 13, 13' and 18 in FIG. 1 and also their neighboring members.
Figure 4:
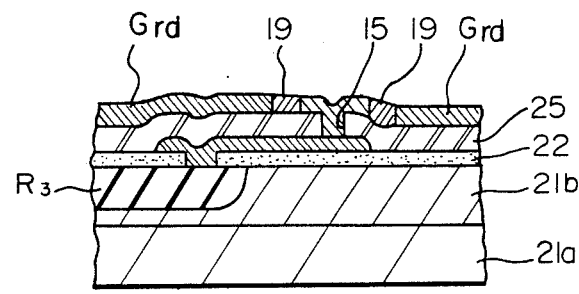
FIG. 4 is a cross sectional view of members 15, 19, P and $R_3$ in FIG. 1 and also their neighboring members.

FIG. 3 is a cross sectional view of the through-holes 13, 13' and the conductor 18 in FIG. 1, and also, their neighbouring members. FIG. 4 is a cross sectional view of the through-hole 15, the conductor 19, the ground line Grd and a resistor R₃ in FIG. 1, and also, their neighboring members.

Figure 5A:
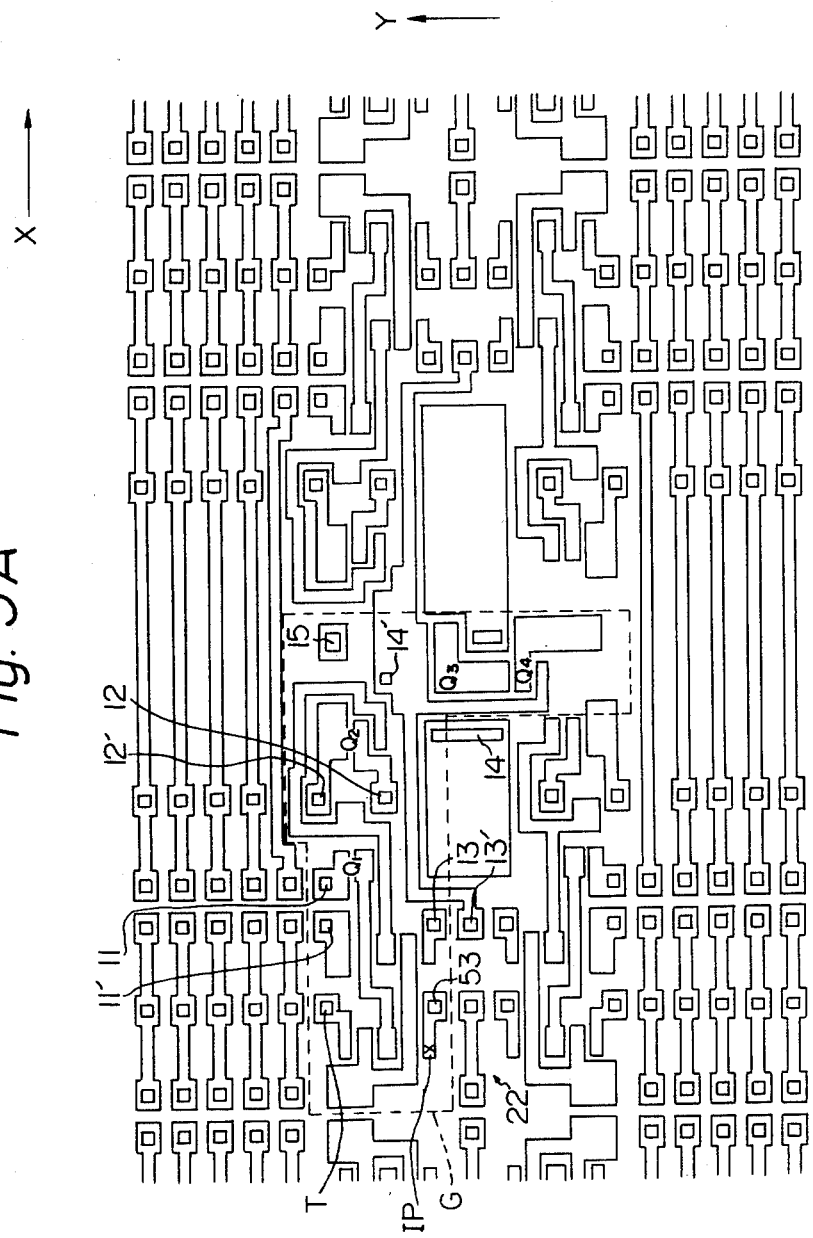
FIG. 5A is an example pattern of the first metal layer and through holes.
Figure 5B:
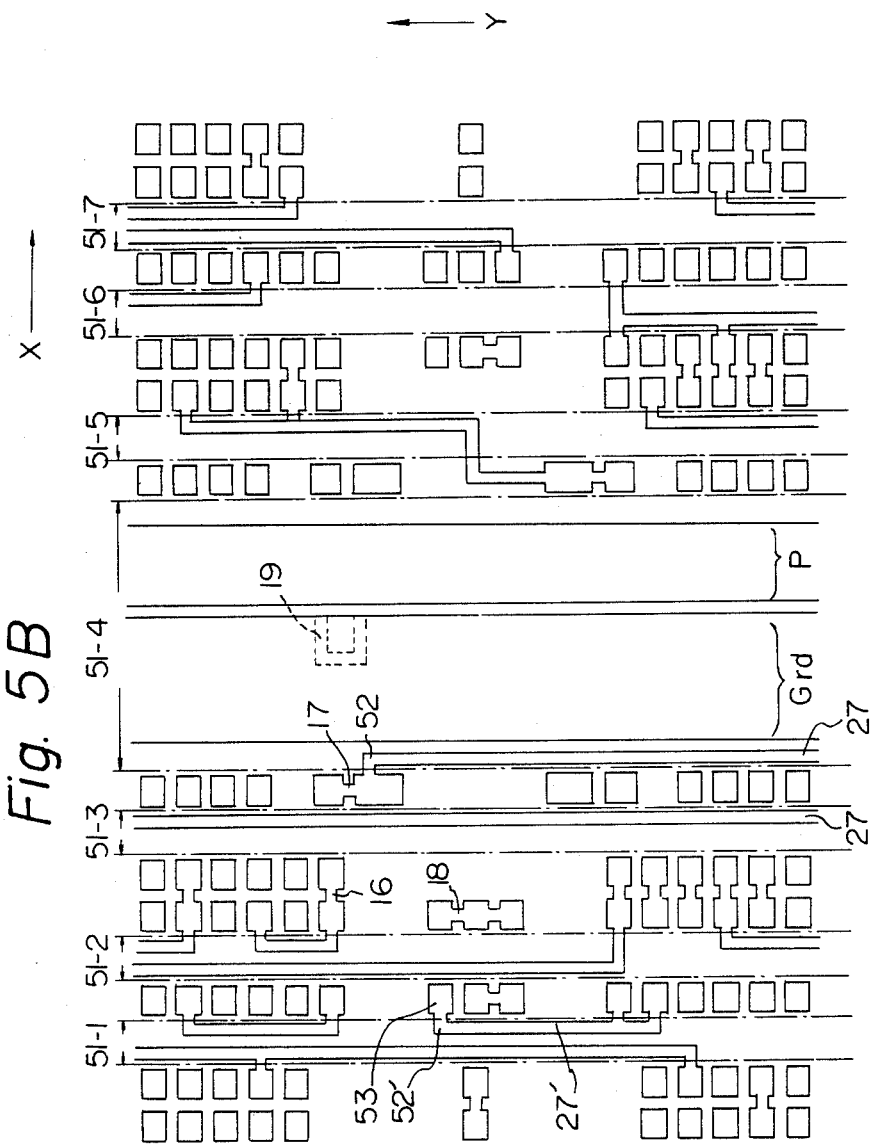
FIG. 5B is an example pattern of the uppermost metal layer of the special type of masterslice semiconductor device, according to the present invention.

As can be seen from FIGS. 1 and 2, there are many through-holes in the second insulation layer 25. Many through-holes are formed in an insulation layer with a grid-like pattern. Therefore, the through-holes (11, 11', 12, 12', 13, 13', T(26) . . . ) may also be distributed in the second insulation layer 25 with the grid-like pattern. One example of semiconductor device is illustrated, in a plan view, in FIGS. 5A and 5B. In FIG. 5A, an example of the first metal layer and the through-holes is illustrated, showing a common pattern for many logic circuits. In FIG. 5B, an example of the second metal layer (in this case, the uppermost metal layer) is illustrated, which has a specific pattern for making desired logic circuits. A pattern of a certain desired ECL logic circuit can be obtained by superposing the pattern of FIG. 5B onto the pattern of FIG. 5A. In FIG. 5A, although semiconductor elements, such as transistors, resistors, are formed under the first metal layer, these semiconductor elements are not shown therein. At the middle area of FIG. 5A, both the first metal layer and the through-hole patterns are illustrated, which first metal layer can accomodate the Quad OR/NOR ECL gates, at most. For example, if the second metal layer of FIG. 5B is superposed onto the pattern of FIG. 5A, the OR/NOR gate can be fabricated at the upper left side of said middle area, the NOR gate can be fabricated at the lower left side thereof, both the OR gate and the resistor can be fabricated at the lower right side thereof, and no OR gate is fabricated at the upper right side thereof. The top metal surface of the semiconductor device is basically divided into through-hole areas and line areas as shown in FIG. 5B. Areas 51-1, 51-2, 51-3, 51-4, 51-5, 51-6 . . . represent the line areas. These line areas 51-1, 51-2 . . . are arranged in the direction of the arrow X with predetermined pitches. On the line areas, the aforesaid interconnecting lines 27, including the conductors 17 and 19, are formed. The power line P and a ground line Grd are formed on, for example, the line area 51-4. Each of the lines extends in the direction of the arrow Y.

On the other hand, the through-holes, such as the through-holes 11, 11', 12, 12', 13, 13', 26 and so on in FIG. 5A, are formed on the through-hole areas, each of which is located between one line area and another line area adjacent thereto. Therefore, the through-hole areas are arranged in parallel to the line areas. As can be seen from FIGS. 5A and 5B, the second interconnecting lines can freely be distributed on the device without being interrupted by the presence of the through-holes. It should be understood that the first interconnecting lines which are used to connect cells or both cells and chip peripherals (shown as the upper and lower areas of FIG. 5A), are distributed on the first insulation layer, in a direction of the arrow X, which is perpendicular to the arrow Y. Any of the second interconnecting lines 27 can be connected to the corresponding through-holes by way of L-shaped conductors 52.

Taking as an example a case where a gate circuit G (indicated by dotted lines in FIG. 5A) having an input port IP, is fabricated on the semiconductor bulk, since the input port IP is located right beneath the line area 51-1, a through-hole which is electrically connected to the port IP would be formed not on the through-hole area but the line area. However, this through-hole must be located on the through-hole area and aligned with other through-holes. In this case, first, the input port IP is electrically connected to the nearest through-hole 53 by way of one of the first interconnecting lines (24) formed on the first insulation layer (22), and then this first interconnecting line is led to the corresponding second interconnecting line 27' via the through-hole 53 and the L-shaped conductor 52' as shown in FIG. 5A and FIG. 5B. Accordingly, the LSI device becomes effectively operable, without the need for additional interconnecting lines over conducting layer out of which the second interconnecting lines are formed. As explained with reference to FIG. 5A and FIG. 5B, it is easy to obtain a high degree of flexibility with regard to the distribution of the second interconnecting lines and there is a capability for achieving a large integration of cells.

As mentioned above, the semiconductor device which satisfies the aforesaid five requirements, can be obtained with the present invention.

We claim:

1. A selected masterslice semiconductor LSI device having different types of logic circuits selectively interconnected, said LSI device having been produced from a common structure, said common structure comprising
   a semiconductor bulk having at least one group of regions of a respective predetermined configuration repeatedly formed therein, said groups of regions being spaced in said semiconductor bulk to define an array in a first direction and a transverse direction along the surface of said semiconductor bulk, each said group of regions corresponding to a basic cell of a respective type,
   a first insulating layer formed on said semiconductor bulk with a common pattern of first windows over the basic cells of the same respective type for exposing the respective regions of each type of basic cell,
   first interconnecting lines selectively formed over said first insulating layer and in said windows, with a common pattern for the basic cells of the same respective type, said first interconnecting lines for each said basic cell including: (a) first portions each having a first end connected to a corresponding one of said regions and a second end located on said first insulating layer; and (b) second portions each extending in said first direction on said first insulating layer, said second portions at each said basic cell being divided into two respective groupings with each said grouping of second portions being located at a respective side of the regions of the respective basic cell, each said second portion of each said basic cell comprising plural separated parts aligned in said first direction with each said separated part extending along said first direction and having two ends located adjacent to a corresponding end of an adjacent one of said separated parts, said second ends of said first portions and said ends of said separated parts of said second portions being arranged in a common alignment in said transverse direction; and
   a second insulating layer formed over said first insulating layer and said first interconnecting lines with a common pattern of second windows formed over said second ends of said first portions and over both said ends of each said separated part of said second portions of said first interconnecting lines, said pattern of second windows having a respective common pattern for the basic cells of each said type, the second windows for both ends of each said separated part of said second portions of said first interconnecting lines being aligned in a row extending in said first direction across said semiconductor bulk, with greater separation along said first direction between adjacent second windows that are over the two ends of the same separated parts than the separation between said second windows over adjacent ends of adjacent ones of said separated parts, said second windows over said ends of said separated parts of said second portions and over a plurality of said second ends of said first portions being aligned in columns extending in said transverse direction across said semiconductor bulk, wherein line areas extending in said transverse direction are formed between said columns of second windows in said second insulating layer, and said selected LSI device comprising a layer out of which second interconnecting lines selectively are formed on said common structure to selectively connect to the first interconnecting lines through correspondingly selected ones of said second windows in said second insulating layer, said layer of second interconnecting lines comprising, at selected ones of said basic cells, to provide said interconnected logic circuits of different types: (a) lines extending in said transverse direction within said line areas and connecting through selected second windows of said columns of second windows on at least one side of the respective line area; and (b) portions outside of said line areas connecting between adjacent second windows in each said column and between adjacent second windows in adjacent ones of said columns of second windows not separated by said line areas, wherein said interconnected logic circuits of said LSI device are effectively provided as a result of said common structure and said layer of second interconnecting lines.

2. The LSI device of claim 1, said layer of second interconnecting lines including a power line and a ground line extending in said transverse direction in at least one respective one of said line areas of selected ones of said basic cells.

3. The LSI device of claim 1 or 2, comprising said second interconnecting lines being formed so as to selectively provide pads over said second windows of said second insulating layer corresponding to the basic cells that are to be connected to form said LSI device.

4. The LSI device of claim 1 or 2, comprising said second interconnecting lines being formed so as to provide pads over all of second the windows of said second insulating layer.

5. The LSI device of claim 1 or 2, said first interconnecting lines consisting of a single wiring layer on said first insulating layer.

* * * * *

UNITED STATES PATENT AND TRADEMARK OFFICE
CERTIFICATE OF CORRECTION

PATENT NO. : 4,500,906

DATED : 19 Feb. 1985

INVENTOR(S) : KENICHI OHNO et al

It is certified that error appears in the above-identified patent and that said Letters Patent is hereby corrected as shown below:

Column 4, line 6, delete "to".

Column 5, line 1, "neighbouring" should be --neighboring--;
          line 31, after "thereof," insert --or--;
          line 32, "and" should be --when--.

Column 8, claim 4, line 3, "second the" should be --the second--.

Signed and Sealed this

Twenty-seventh Day of August 1985

[SEAL]

Attest:

DONALD J. QUIGG

Attesting Officer     Acting Commissioner of Patents and Trademarks